(12) United States Patent
Mizuguchi et al.

(10) Patent No.: US 9,085,705 B2
(45) Date of Patent: Jul. 21, 2015

(54) PHOTOSENSITIVE CONDUCTIVE PASTE AND METHOD OF PRODUCING CONDUCTIVE PATTERN

(71) Applicant: Toray Industries, Inc., Tokyo (JP)

(72) Inventors: Tsukuru Mizuguchi, Otsu (JP); Satoshi Matsuba, Nagoya (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 14/386,876

(22) PCT Filed: Mar. 4, 2013

(86) PCT No.: PCT/JP2013/055809
§ 371 (c)(1),
(2) Date: Sep. 22, 2014

(87) PCT Pub. No.: WO2013/146107
PCT Pub. Date: Oct. 3, 2013

(65) Prior Publication Data
US 2015/0056560 A1    Feb. 26, 2015

(30) Foreign Application Priority Data
Mar. 28, 2012 (JP) ................. 2012-073338

(51) Int. Cl.
| | | |
|---|---|---|
| G03F 7/027 | (2006.01) | |
| G03F 7/40 | (2006.01) | |
| H03B 13/00 | (2006.01) | |
| H05K 1/09 | (2006.01) | |
| C09D 5/24 | (2006.01) | |
| H01B 1/22 | (2006.01) | |
| G03F 7/004 | (2006.01) | |
| G03F 7/038 | (2006.01) | |
| H05K 1/02 | (2006.01) | |

(52) U.S. Cl.
CPC ............... *C09D 5/24* (2013.01); *G03F 7/0047* (2013.01); *G03F 7/027* (2013.01); *G03F 7/038* (2013.01); *G03F 7/40* (2013.01); *H01B 1/22* (2013.01); *H05K 1/028* (2013.01); *H05K 1/0296* (2013.01); *H05K 1/092* (2013.01); *H05K 2201/0145* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 3,418,295 A | * | 12/1968 | Schoenthaler | ............... 525/259 |
| 3,448,089 A | * | 6/1969 | Celeste | ................. 525/286 |
| 4,422,914 A | * | 12/1983 | Tsao et al. | ................. 522/33 |
| 4,828,961 A | * | 5/1989 | Lau et al. | .................. 430/198 |
| 5,972,564 A | * | 10/1999 | Kawana et al. | ........... 430/281.1 |
| 2005/0079447 A1 | * | 4/2005 | Uegaki et al. | ........... 430/284.1 |

FOREIGN PATENT DOCUMENTS

| | | | |
|---|---|---|---|
| JP | 2-206675 A | | 8/1990 |
| JP | 9-222723 A | | 8/1997 |
| JP | 09-222723 A | * | 8/1997 |
| JP | 10-64333 A | | 3/1998 |
| JP | 2003-162921 | | 6/2003 |
| JP | 2004-264655 A | * | 9/2004 |
| JP | 2004-264655 A | | 9/2004 |
| JP | 2007-207567 | | 8/2007 |
| JP | 2008-129503 A | | 6/2008 |
| JP | 2008-129503 A | * | 6/2008 |
| JP | 2009-237245 A | | 10/2009 |
| JP | 2009-237245 A | * | 10/2010 |
| JP | 2011-64864 A | * | 3/2011 |
| JP | 2011-064864 A | | 3/2011 |
| JP | 2011-170197 A | | 9/2011 |
| WO | WO-02/094904 A1 | * | 11/2002 |
| WO | 2004061006 | | 7/2004 |

OTHER PUBLICATIONS

English translation of JP, 2008-129503, A (2008) from machine translation from AIPN Japan Patent Office National Center for Industrial Property Information and Training, generated Feb. 22, 2015, 17 pages.*
English abstract from Scifinder database for JP 2008129503, Accession No. 2008:669556, CAN 149:21048 in CAPLUS, 3 pages.*

* cited by examiner

*Primary Examiner* — Cynthia Hamilton
(74) *Attorney, Agent, or Firm* — DLA Piper LLP (US)

(57) ABSTRACT

A photosensitive conductive paste includes an epoxy acrylate (A) including a urethane bond, a photopolymerization initiator (B), and a conductive filler (C), wherein an added amount of the conductive filler (C) is 70 to 95% by weight with respect to the total solids in the photosensitive conductive paste.

19 Claims, 1 Drawing Sheet

PHOTOSENSITIVE CONDUCTIVE PASTE AND METHOD OF PRODUCING CONDUCTIVE PATTERN

TECHNICAL FIELD

This disclosure relates to a photosensitive conductive paste and a method of producing a conductive pattern using the photosensitive conductive paste.

BACKGROUND

The term "conductive pattern" refers to a conductive pattern comprising both an organic component such as a resin and an inorganic component such as a conductive filler.

Thus far, for the formation of such an organic-inorganic composite conductive pattern as described above, so-called "polymer-type" conductive pastes in which a resin and/or adhesive is mixed with a large amount of fine particulate silver flakes, copper powder or carbon particles have been put into practice.

Many of the practically used polymer-type conductive pastes can be to form a pattern by screen printing and are capable of yielding a conductive pattern when heat-cured (JP H02-206675 A and JP 2007-207567 A).

For the purpose of forming patterns of 100 μm or smaller with good accuracy, there have been disclosed an acid-etchable conductive paste (JP H10-64333 A) and photosensitive curable conductive pastes (WO 2004/61006).

However, in the screen printing methods disclosed in JP '675 and JP '567, it is difficult to form a pattern of 100 μm or smaller with good accuracy.

Further, to perform patterning of the conductive paste described in JP '333 by photolithography, there is a problem that a resist layer must be formed on a coating film and this leads to an increase in the number of necessary steps. In the methods described in WO '006, a fine pattern can be easily obtained by imparting a conductive paste with photosensitivity. In the method of WO '006, there are problems not only that the acryl(methacryl) equivalent must be reduced to allow conductivity to be exhibited. The conductive pattern obtained by that method is fragile, making it difficult to apply the conductive pattern onto a flexible substrate. Also, the conductive pattern has poor adhesion with glass and ITO (indium tin oxide) electrode arranged on a film substrate.

It could therefore be helpful to provide a photosensitive conductive paste and a conductive pattern production method capable of yielding a conductive pattern exhibiting strong adhesion with ITO on a substrate, can be finely patterned, exhibits electrical conductivity at relatively low temperatures and, under certain circumstances, has flexibility.

SUMMARY

We thus provide:

A photosensitive conductive paste comprising: an epoxy acrylate (A) comprising a urethane bond; a photopolymerization inhibitor (B); and a conductive filler (C).

A method of producing a conductive paste comprising: coating the above-described photosensitive conductive paste on a substrate, and drying, exposing and developing the thus coated photosensitive conductive paste; and subsequently curing the photosensitive conductive paste at a temperature of 100° C. to 300° C.

It is preferred that the above-described epoxy acrylate (A) comprising a urethane bond comprise a carboxyl group.

It is preferred that the above-described epoxy acrylate (A) comprising a urethane bond have an acid value of 40 to 250 mg KOH/g.

It is preferred that the above-described epoxy acrylate (A) comprises a urethane bond contain an unsaturated double bond.

It is preferred that the above-described epoxy acrylate (A) comprises a urethane bond have a bisphenol A skeleton, a bisphenol F skeleton, a biphenyl skeleton or a hydrogenated bisphenol A skeleton.

It is preferred that the above-described epoxy acrylate (A) comprises a urethane bond have a glass transition temperature of −10 to 60° C.

It is preferred that the photosensitive conductive paste further comprises a dicarboxylic acid or an acid anhydride thereof (D).

A conductive pattern exhibiting excellent adhesion with ITO and having a low specific resistivity even in low-temperature curing conditions can be obtained and this conductive pattern is highly photosensitive and can thus be finely patterned. In addition, preferably, fine bumps, wirings and the like can be easily formed not only on a rigid substrate, but also on a flexible substrate.

DESCRIPTION OF SYMBOLS

Figure 1:
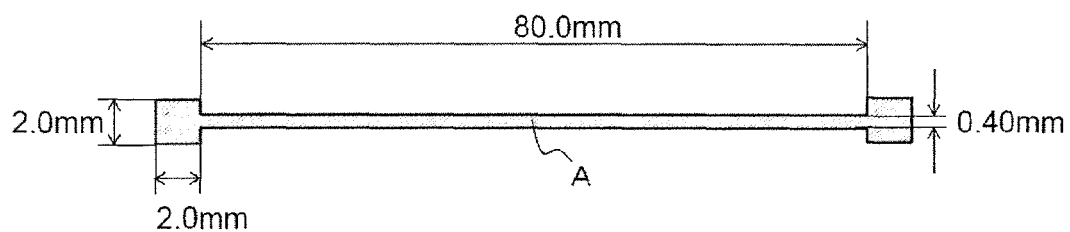
FIG. 1 is a schematic diagram showing the transparent pattern of the photomask used to evaluate the specific resistivity in the Examples.

A: Light-transmitting part
B, C: Short side of sample
D: Conductive pattern
E: PET film

DETAILED DESCRIPTION

A conductive filler (C) is dispersed in a photosensitive resin composition composed of an epoxy acrylate (A) comprising a urethane bond and a photopolymerization initiator (B).

This photosensitive conductive paste can yield a desired conductive pattern on a substrate when it is coated on the substrate; dried as required to remove its solvent; exposed; developed; and then cured at a temperature of 100° C. to 300° C. The conductive pattern obtained from the paste is in the form of a composite of organic and inorganic components and the contact between the conductive filler molecules that is induced by shrinkage on curing in the curing process allows conductivity to be expressed.

The epoxy acrylate (A) comprising a urethane bond contained in the photosensitive conductive paste refers to a compound comprising at least one hydroxyl group generated by ring-opening of an epoxy group in the molecule.

The epoxy acrylate (A) comprising a urethane bond can be produced by allowing epoxy acrylate (a), which is obtained by reaction between an epoxy compound and a monocarboxylic acid compound comprising an unsaturated double bond and a carboxyl group, to react with a diisocyanate compound (b) and a diol compound (c).

Further, a compound (A) comprising a carboxyl group can be obtained by converting the diol compound (c) into a diol compound comprising a carboxyl group. Moreover, a compound (A) comprising an unsaturated double bond can be obtained by allowing the epoxy acrylate (A) comprising a urethane bond and a carboxyl group to react with an epoxy compound (d) comprising an unsaturated double bond.

Specific examples of the epoxy acrylate (a) include EPOXY ESTER 40EM (manufactured by Kyoeisha Chemical Co., Ltd.), EPOXY ESTER 70PA (manufactured by Kyoeisha Chemical Co., Ltd.), EPOXY ESTER 80MFA (manufactured by Kyoeisha Chemical Co., Ltd.), EPOXY ESTER 3002M (manufactured by Kyoeisha Chemical Co., Ltd.), CN104 (manufactured by Sartomer Inc.), CN121 (manufactured by Sartomer Inc.), EBECRYL 3702 (manufactured by DAICEL-CYTEC Ltd.), EBECRYL 3700 (manufactured by Daicel-Cytec Ltd.) and EBECRYL 600 (manufactured by Daicel-Cytec Ltd.).

The diisocyanate compound (b) may be any compound as long as it has two isocyanate groups in the molecule, and specific examples thereof include toluene diisocyanate, diphenylmethane-4,4'-diisocyanate, hexamethylene diisocyanate, tetramethyl xylene diisocyanate, naphthalene-1,5-diisocyanate, tolidene diisocyanate, trimethylhexamethylene diisocyanate, isophorone diisocyanate, allylcyan diisocyanate and norbornane diisocyanate.

Examples of the diol compound (c) include methanediol, 1,3-propanediol, 1,4-butane-diol, benzenediol, 1,6-hexanediol, 1,2-cyclohexanediol, 2-butene-1,4-diol, butylethylpropanediol and 1,4-butynediol, and examples of the diol compound comprising a carboxyl group include dihydroxypropionic acid and 2,2-bis(hydroxymethyl)propionic acid.

Examples of the epoxy compound (d) comprising an unsaturated double bond in the molecule include glycidyl acrylate and glycidyl methacrylate.

Urethanization reaction is performed by adding the diol compound (c) comprising a carboxyl group to the epoxy acrylate (a) and then slowly adding the diisocyanate compound (b) thereto. This urethanization reaction can be performed in the absence of catalyst. However, a basic catalyst may be used to accelerate the reaction. The amount of the catalyst is 10% by weight or less with respect to the amount of the reactants. In this case, the reaction temperature is 40 to 120° C. and the reaction time is preferably 5 to 60 hours. A solvent and/or a thermal polymerization inhibitor may be used as well. While sampling as appropriate, the reaction is terminated when the sample no longer shows absorption at about 2,250 $cm^{-1}$ in infrared absorption spectrum.

Then, to the thus obtained reaction solution, the epoxy compound (d) comprising an unsaturated double bond in the molecule is added to perform an epoxy-acrylation reaction with the diol compound (c) comprising a carboxyl group. This epoxy-acrylation reaction can be performed in the absence of catalyst. However, a basic catalyst may be used to accelerate the reaction. The amount of the catalyst is 10% by weight or less with respect to the amount of the reactants. In this case, the reaction temperature is 40 to 120° C. and the reaction time is preferably 5 to 60 hours. A solvent and/or a thermal polymerization inhibitor may be used as well.

At the time of performing these reactions, it is preferred to use a catalyst to accelerate the reactions. Specific examples of the catalyst include triethylamine, benzyldimethylamine, triethylammonium chloride, benzyltrimethylammonium bromide, benzyltrimethylammonium iodide, triphenyl phosphine, triphenylstibine, methyltriphenylstibine, chromium octanoate and zirconium octanoate.

As for the amount of each component to be loaded, when the loaded amount of the epoxy acrylate (a), that of the diisocyanate compound (b) and that of the diol compound (c) comprising a carboxyl group are defined as x equivalent, y equivalent and z equivalent, respectively, the equivalence ratio is preferably in the following range: $5 \geq (x+z)/y \geq 1$. When the value of $(x+z)/y$ is less than 1, since the isocyanate group remains at a terminal, the resulting epoxy acrylate has low thermal stability and may thus form a gel during storage, which is not preferred. Meanwhile, when this value is higher than 5, the resulting epoxy acrylate has a low molecular weight so that problems of tackiness and low sensitivity may arise.

The epoxy acrylate (A) comprising a urethane bond can be developed with a solvent or an aqueous alkaline solution. When it is developed with an aqueous alkaline solution, the compound (A) preferably has an acid value of 40 to 250 mg KOH/g. When the acid value is less than 40 mg KOH/g, there is a problem that the solubility of the soluble portion in the developing solution is reduced, while when the acid value is higher than 250 mg KOH/g, the developable range cannot be expanded. The acid value is determined in accordance with JIS K 0070 (1992).

The epoxy acrylate (A) comprising a urethane bond contained in the photosensitive conductive paste has a glass transition temperature (Tg) of preferably −10 to 50° C., more preferably 10 to 40. When the Tg is −10° C. or higher, the tackiness of the dried film can be suppressed and, when the Tg is 10° C. or higher, high shape stability is attained particularly against temperature changes. Further, when the Tg is 50° C. or lower, the resulting paste can exhibit flexibility at room temperature and, when the Tg is 50° C. or lower, the internal stress generated by bending can be alleviated so that particularly crack generation can be restrained.

The glass transition temperature of the epoxy acrylate (A) comprising a urethane bond contained in the photosensitive conductive paste can be determined by differential scanning calorimetry (DSC) of the photosensitive component.

The photopolymerization initiator (B) contained in the photosensitive conductive paste refers to a compound which absorbs short-wavelength light such as ultraviolet radiation to be decomposed and generate radicals or a compound which undergoes hydrogen abstraction reaction to generate radicals. Specific examples of the photopolymerization initiator (B) include, but not particularly limited to, 1,2-octanedione, 1-[4-(phenylthio)-2-(o-benzoyloxime)], 2,4,6-trimethylbenzoyl-diphenyl-phosphine oxide, bis(2,4,6-trimethylbenzoyl)-phenylphosphine oxide, ethanone, 1-[9-ethyl-6-2(2-methylbenzoyl)-9H-carbazole-3-yl]-1-(o-acetyloxime), benzophenone, methyl o-benzoylbenzoate, 4,4'-bis(dimethylamino)benzophenone, 4,4'-bis(diethylamin-o)benzophenone, 4,4'-dichlorobenzophenone, 4-benzoyl-4'-methyl diphenyl ketone, dibenzyl ketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzil, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methyleneanthrone, 4-azidebenzalacetophenone, 2,6-bis(p-azidobenzylidene)cyclohexanone, 6-bis(p-azidobenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, 2,4-diethylthioxanthone, isopropylthioxanthone, carbon tetrabromide, tribromophenylsulfone, benzoin peroxide, and combinations of a photoreducible dye such as eosin or Methylene Blue, and a reducing agent such as ascorbic acid or triethanolamine.

The photopolymerization initiator (B) is added in an amount of preferably 0.05 to 30 parts by weight, more preferably 5 to 20 parts by weight, with respect to 100 parts by weight of the epoxy acrylate (A) comprising a urethane bond. By adding the photopolymerization initiator (B) in an amount of 5 parts by weight or more with respect to 100 parts by weight of the compound (A), particularly the curing density of the exposed parts is increased and the post-development residual film ratio can thus be improved. Further, by adding the photopolymerization initiator (B) in an amount of 20 parts by weight or less with respect to 100 parts by weight of the compound (A), particularly, excessive light absorption by the photopolymerization initiator (B) in the upper part of the coated film can be inhibited so that a reduction of an adhesiveness of the conductive pattern to the substrate by being a reverse taper-shape can be restrained.

By incorporating a sensitizer along with the photopolymerization initiator (B), sensitivity can be improved and the wavelength range effective for reactions can be expanded.

Specific examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonyl-bis(4-diethylaminobenzal)acetone, 3,3-carbonyl-bis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole and 1-phenyl-5-ethoxycarbonylthiotetrazole. These sensitizers can be used individually, or two or more thereof may be used in combination. When a sensitizer(s) is/are added to the photosensitive conductive paste, it is usually preferred that the amount thereof be 0.05 to 10 parts by weight, more preferably 0.1 to 10 parts by weight, with respect to 100 parts by weight of the compound (A). By adding a sensitizer(s) in an amount of 0.1 parts by weight or more with respect to 100 parts by weight of the compound (A), the effect of improving photosensitivity is likely to be exerted sufficiently and, by adding a sensitizer(s) in an amount of 10 parts by weight or less with respect to 100 parts by weight of the compound (A), particularly, excessive light absorption in the upper part of the coated film can be inhibited so that a reduction of an adhesiveness of the conductive pattern to the substrate by being a reverse taper-shape can be inhibited.

It is preferred that the conductive filler (C) contained in the photosensitive conductive paste comprise at least one of Ag, Au, Cu, Pt, Pb, Sn, Ni, Al, W, Mo, ruthenium oxide, Cr, Ti and indium, and such conductive fillers can be used individually or in the form of an alloy or mixed powder. Further, conductive particles that are prepared by coating the surfaces of insulating particles or conductive particles with the above-described component(s) can also be used in the same manner. Among the above-described components, from the standpoint of the conductivity, Ag, Cu and Au are preferred and, from the standpoints of the cost and stability, Ag is more preferred.

The conductive filler (C) has a volume-average particle size of preferably 0.1 to 10 µm, more preferably 0.5 to 6 µm. When the volume-average particle size is 0.1 µm or larger, the probability of the contact between the conduct filler molecules is improved so that the specific resistance and breakage probability of the resulting conductive pattern can both be reduced and ultraviolet light can smoothly transmit through the film during exposure, which makes fine-patterning easy. Meanwhile, when the volume-average particle size is 10 µm or smaller, the surface smoothness, pattern accuracy and dimensional accuracy of the printed circuit pattern are improved. The volume-average particle size can be determined by a Coulter counter method.

The conductive filler (C) is added in an amount of preferably 70 to 95% by weight, more preferably 80 to 90% by weight, with respect to the total solids in the photosensitive conductive paste. By adding the conductive filler (C) in an amount of 70% by weight or more, particularly the probability of the contact between the conduct filler molecules that is induced by shrinkage on curing in the curing process is improved so that the specific resistance and breakage probability of the resulting conductive pattern can both be reduced. Further, by adding the conductive filler (C) in an amount of 95% by weight or less, particularly ultraviolet light is allowed to smoothly transmit through the film during exposure, which makes fine-patterning easy.

Examples of the dicarboxylic acid compound of the dicarboxylic acid or acid anhydride thereof (D) that is contained in the photosensitive conductive paste include oxalic acid, malonic acid, succinic acid, glutaric acid, adipic acid, pimelic acid, suberic acid, azelaic acid, sebacic acid, phthalic acid, isophthalic acid, terephthalic acid, 2-methylmalonic acid, 2-ethylmalonic acid, 2-propylmalonic acid, 2-butylmalonic acid, 2-(3-methoxypropyl)malonic acid, 2-(3-propoxypropyl)malonic acid, 2-(3-propoxybutyl)malonic acid, (E)-2-(hexa-4-ethyl)malonic acid, 2-methylsuccinic acid, 2-ethylsuccinic acid, 2-propylsuccinic acid, 2-butylsuccinic acid, 2-(3-methoxypropyl)succinic acid, 2-(3-propoxypropyl)succinic acid, 2-(3-propoxybutyl)succinic acid, (E)-2-(hexa-4-ethyl)succinic acid, 2-methyldioic acid, 2-ethyldioic acid, 2-propyldioic acid, 2-butyldioic acid, 2-(3-methoxypropyl)dioic acid, 2-(3-propoxypropyl)dioic acid, 2-(3-propoxybutyl)dioic acid, (E)-2-(hexa-4-ethyl)dioic acid, 2-hexylpentane dioic acid, 3-hexylpentane dioic acid, 2-methylmaleic acid, 2-ethylmaleic acid, 2-propylmaleic acid, 2-butylmaleic acid, 2-(3-methoxypropyl)maleic acid, 2-(3-propoxypropyl)maleic acid, 2-(3-propoxybutyl)maleic acid, (E)-2-(hexa-4-ethyl)maleic acid, 2-hexylmalonic acid, 2-(3-ethoxypropyl)succinic acid, 2-(3-ethoxybutyl)succinic acid, (E)-2(hexa-1-enyl)succinic acid, 3-hexylpentane dioic acid and (E)-2-(hexa-4-ethyl)succinic acid. Further, the term "acid anhydride" used herein refers to a compound produced by dehydration condensation of two of the above-described carboxylic acid compounds.

The dicarboxylic acid or acid anhydride thereof (D) is added in an amount of preferably 0.5 to 30 parts by weight, more preferably 1 to 20 parts by weight, with respect to 100 parts by weight of the epoxy acrylate (A) comprising a urethane bond. By adding the dicarboxylic acid or acid anhydride thereof (D) in an amount of 0.5 parts by weight or more with respect to 100 parts by weight of the compound (A), not only the affinity to a developing solution can be improved and good patterning can be attained, but also conductivity of the final composition is improved. Meanwhile, by adding an acid anhydride in an amount of 30 parts by weight or less, the development margin, the adhesion under high-temperature and high-humidity conditions can be improved.

The photosensitive conductive paste may also contain a solvent. Examples of the solvent include N,N-dimethylacetamide, N,N-dimethylformamide, N-methyl-2-pyrrolidone, dimethylimidazolidinone, dimethyl sulfoxide, diethylene glycol monoethyl ether, diethylene glycol monoethyl ether acetate, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol and propylene glycol monomethyl ether acetate. These solvents may be used individually, or two or more thereof may be used in combination. The solvent(s) may be added after the preparation of the paste for the purpose of adjusting the viscosity.

The photosensitive conductive paste may also contain, in such a range that does not impair its desired properties, an additive(s) having no unsaturated double bond in the molecule such as a non-photosensitive polymer, a plasticizer, a leveling agent, a surfactant, a silane coupling agent, an antifoaming agent and/or a pigment. Specific examples of the non-photosensitive polymer include epoxy resins, novolac resins, phenolic resins, polyimide precursors and ring-closed polyimides.

Specific examples of the plasticizer include dibutyl phthalate, dioctyl phthalate, polyethylene glycol and glycerin. Specific examples of the leveling agent include special vinyl polymers and special acrylic polymers.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane and vinyltrimethoxysilane.

The photosensitive conductive paste is produced using, for example, a dispenser or a kneader. Specific examples thereof include, but not limited to, a 3-roll mill, a ball mill and a planetary ball mill.

A method of producing a conductive pattern using the photosensitive conductive paste will now be described. To produce a conductive pattern, the paste is coated on a substrate and then dried by evaporating the solvent with heating. Thereafter, the paste is exposed through a pattern-forming mask and then developed to form a desired pattern on the substrate. The thus formed pattern is subsequently cured at a temperature of 100° C. to 300° C., thereby a conductive pattern is produced. The curing temperature is preferably 120 to 180° C. When the heating temperature is lower than 100° C., the volume shrinkage of the resin cannot be increased and the specific resistivity thus cannot be reduced. Meanwhile, when the heating temperature is higher than 300° C., a substrate having low heat resistance cannot be used and it is also impossible to use a material having low heat resistance in combination with the paste.

Examples of the substrate include, but not limited to, polyethylene terephthalate films (hereinafter, referred to as "PET films"), polyimide films, polyester films, aramid films, epoxy resin substrates, polyether imide resin substrates, polyether ketone resin substrates, polysulfone-based resin substrates, glass substrates, decorative layer-formed substrates, insulating layer-formed substrates, silicon wafers, alumina substrates, aluminum nitride substrates and silicon carbide substrates.

As a method of coating the photosensitive conductive paste on a substrate, for example, rotary coating using a spinner, spray coating, roll coating, screen printing, or a method using a blade coater, a die coater, a calender coater, a meniscus coater or a bar coater can be employed. The coated film thickness varies depending on, for example, the coating method as well as the total solid concentration and viscosity of the composition; however, normally, the photosensitive conductive paste is coated such that the post-drying film thickness is 0.1 to 50 μm.

Then, the solvent is removed from the coating film formed on the substrate. Examples of the method of removing the solvent include heat-drying using an oven, a hot plate, infrared radiation or the like; and vacuum drying. The heat-drying is preferably performed at 50° C. to 180° C. for a period of 1 minute to several hours.

After solvent removal, the coating film is subjected to patterning by photolithography. As a light source for exposure, it is preferred to use the i-line (365 nm), h-line (405 nm) and/or g-line (436 nm) emitted from a mercury lamp.

After exposure, by removing non-exposed parts using a developing solution, a desired pattern can be obtained. As a developing solution for performing alkali development, an aqueous solution of tetramethylammonium hydroxide, diethanolamine, diethylamino ethanol, sodium hydroxide, potassium hydroxide, sodium carbonate, potassium carbonate, triethylamine, diethylamine, methylamine, dimethylamine, dimethylaminoethyl acetate, dimethylamino ethanol, dimethylaminoethyl methacrylate, cyclohexylamine, ethylene diamine, hexamethylene diamine or the like is preferably used. Further, depending on the case, the above-described aqueous solution in which one or more of, for example, polar solvents such as N-methyl-2-pyrrolidone, N,N-dimethylformamide, N,N-dimethylacetamide, dimethylsulfoxide and γ-butyrolactone, alcohols such as methanol, ethanol and isopropanol, esters such as ethyl lactate, propylene glycol monomethyl ether acetate and ketones such as cyclopentanone, cyclohexanone, isobutyl ketone and methyl isobutyl ketone is/are mixed may be used as the developing solution. Further, the above-described aqueous alkaline solution in which a surfactant is added can also be used as the developing solution. As a developing solution for performing organic development, polar solvents such as N-methyl-2-pyrrolidone, N-acetyl-2-pyrrolidone, N,N-dimethylacetamide, N,N-dimethylformamide, dimethyl sulfoxide and hexamethylphosphorustriamide can be used individually or in combination with methanol, ethanol, isopropyl alcohol, xylene, water, methylcarbitol, ethylcarbitol or the like as a mixed solution.

Development can be performed by, for example, a method of spraying the above-described developing solution onto the coating film surface while leaving the substrate to stand or rotating the substrate, a method of immersing the substrate in the developing solution, or a method of applying ultrasonic wave to the substrate while immersing the substrate.

After development, the substrate may be subjected to a rinsing treatment with water. The rinsing treatment may be performed using a solution prepared by adding an alcohol such as ethanol or isopropyl alcohol or an ester such as ethyl lactate or propylene glycol monomethyl ether acetate to water.

Then, to allow conductivity to be exerted, the paste composition film is cured. Examples of the curing method include heat-drying using an oven, an inert oven, a hot plate, infrared radiation or the like; and vacuum drying. A conductive pattern can be produced through such a curing process.

A conductive pattern produced from the photosensitive conductive paste can be suitably used as a peripheral circuit of a touch panel. Examples of the touch panel include resistance film-type, optical-type, electromagnetic induction-type and capacitance-type touch panels and, in capacitance-type touch panels, since particularly fine wiring is demanded, a conductive pattern produced from the photosensitive conductive paste can be more suitably used.

EXAMPLES

Our pastes and methods will now be described by way of examples thereof. However, this disclosure is not restricted thereto. The materials and evaluation methods used in Examples and Comparative Examples are described below.
Method of Evaluating Patterning Property The subject photosensitive conductive paste was coated on a PET film to a dry thickness of 7 μm and dried in a 100° C. drying oven for 5 minutes. The photosensitive conductive paste was then exposed through a transparent-patterned photomask having 9 units with different line-and-space (L/S) values, each of which units was constituted by a group of straight lines arranged at a constant L/S value, and subsequently developed. Thereafter, the thus developed photosensitive conductive paste was cured in a drying oven at 140° C. for 30 minutes, thereby obtaining conductive patterns. The L/S values of the respective units were set at 500/500, 250/250, 100/100, 50/50, 40/40, 30/30, 25/25, 20/20 and 15/15 (each value represents "line width (μm)/space (μm)"). The thus obtained patterns were observed under an optical microscope and a pattern having the smallest L/S value, which contained no residue and showed no detachment, was identified. The smallest L/S value was defined as developable L/S.
Method of Evaluating Specific Resistivity The subject photosensitive conductive paste was dried in a 100° C. drying oven for 5 minutes, exposed through a photomask having a light-transmitting part A patterned as shown in FIG. 1, developed and then cured in a drying oven at 140° C. for 30 minutes, thereby obtaining a conductive pattern for the measurement of specific resistivity. This conductive pattern had a line width of 0.400 mm and a line length of 80 mm. The ends of the thus obtained pattern were connected to a surface resistance meter to measure the surface resistance. The measured value was substituted into the following equation to calculate the specific resistivity:

Specific resistivity=Surface resistance value×Film thickness×Line width/Line length.

Figure 2:
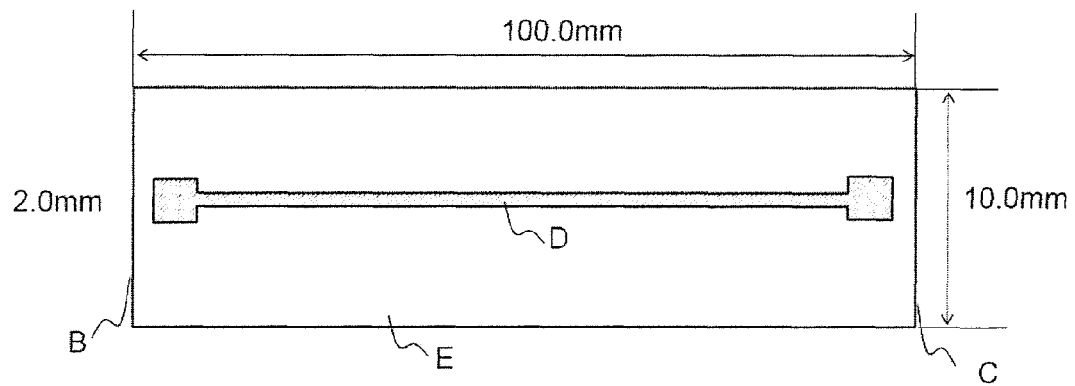
FIG. 2 is a schematic diagram showing a sample used in the flexibility test of Examples.

The film thickness was measured using a probe-type step profiler, SURFCOM (registered trademark) 1400 (manufactured by Tokyo Seimitsu Co., Ltd.). The thickness of the subject film was measured at three spots that were randomly selected and the average of the measured values was taken as the film thickness. The measurement length was 1 mm and the scanning rate was set at 0.3 mm/sec. As for the line width, the subject line was observed under an optical microscope at three spots that were randomly selected, and the average of three values obtained by analyzing image data was taken as the line width.
Method of Evaluating Flexibility FIG. 2 is a schematic diagram showing a sample used in the flexibility test. The subject photosensitive conductive paste was coated on a rectangular PET film of 10 mm in width and 100 mm in length (thickness: 40 μm) to a dry thickness of 7 μm and dried in a 100° C. drying oven for 5 minutes. The photosensitive conductive paste was then exposed through a photomask having the light-transmitting part A patterned as shown in FIG. 1, which was arranged such that the light-transmitting part was positioned in the center of the sample, and subsequently developed. Thereafter, the thus developed photosensitive conductive paste was cured in a drying oven at 140° C. for 30 minutes, thereby forming a conductive pattern. The resistance of this conductive pattern was measured using a tester. Then, after repeating a bending operation 100 times, in which bending operation the short sides B and C of the sample were brought into contact with each other by bending the sample such that the conductive pattern alternately faced inside and outside and the sample is then brought back to the original state, the resistance of the conductive pattern was measured again using the tester. Based on the measurement results, an evaluation of "good" was given when the change in the resistance was 20% or less and the conductive pattern showed no cracking, detachment, breakage or the like, or an evaluation of "poor" was given otherwise.
Method of Evaluating Adhesion with ITO The subject photosensitive conductive paste was coated to a dry thickness of 7 μm on an ITO-deposited PET film, ELECRYSTA (registered trademark) V270L-TFS (manufactured by Nitto Denko Corporation), and dried in a 100° C. drying oven for 5 minutes. The entire printed surface was exposed and subsequently cured in a drying oven at 140° C. for 30 minutes. Then, using a cutter, cuts of 1 mm in width were made on the cured surface in the form of 10×10 grids, and the resulting sample was placed in a thermo-hygrostat chamber, SH-661 (manufactured by ESPEC Corp.), at 85° C. and 85% RH for 240 hours. Thereafter, the sample was taken out and a tape was pasted over the grid part and then peeled off to evaluate the number of remaining grids. As the tape, a cellophane tape (manufactured by Nichiban Co., Ltd.) was used.

Epoxy Acrylate (A) Comprising Urethane Bond

Synthesis Example A-1

To a reaction vessel, 200 g of EPOXY ESTER 3000A (manufactured by Kyoeisha Chemical Co., Ltd., molecular weight: 476.7; comprising a bisphenol A skeleton), 500 g of diethylene glycol monoethyl ether acetate, 0.5 g of 2-methylhydroquinone and 75 g of dihydroxypropionic acid (molecular weight: 106.1) were added as an epoxy acrylate compound (a), reaction solvent, thermal polymerization inhibitor and diol compound comprising a carboxyl group, respectively, and the temperature was raised to 45° C. To this solution, as a diisocyanate compound (b), 84.1 g of hexamethylene diisocyanate (molecular weight: 168.2) was slowly added dropwise such that the reaction temperature did not exceed 50° C. After the completion of the addition, the temperature was raised to 80° C. and the components were allowed to react for 6 hours until the solution no longer showed absorption at about 2,250 cm$^{-1}$ as determined by infrared absorption spectrometry. To the resulting solution, as an epoxy compound (d) comprising an unsaturated double bond in the molecule, 165 g of glycidyl methacrylate (molecular weight: 142.2) was added. Then, the temperature was raised to 95° C. to allow reaction to take place for 6 hours, thereby obtaining a photosensitive resin solution containing 51.2% by weight of the epoxy acrylate (A-1) comprising a urethane bond. The thus obtained compound (A-5) had an acid value of 89 mg KOH/g and a glass transition temperature, which was determined by DSC measurement, of 27.2° C.

Synthesis Example A-2

To a reaction vessel, 200 g of EPOXY ESTER 3000A (manufactured by Kyoeisha Chemical Co., Ltd., molecular weight: 476.7; comprising a bisphenol A skeleton), 500 g of diethylene glycol monoethyl ether acetate, 0.5 g of 2-methylhydroquinone and 100 g of 1,6-hexanediol (molecular weight: 118.2) were added as an epoxy acrylate compound (a), reaction solvent, thermal polymerization inhibitor and diol compound, respectively, and the temperature was raised to 45° C. To this solution, as a diisocyanate compound (b), 71.0 g of hexamethylene diisocyanate (molecular weight: 168.2) was slowly added dropwise such that the reaction temperature did not exceed 50° C. After the completion of the addition, the temperature was raised to 80° C. and the components were allowed to react for 6 hours until the solution no longer showed absorption at about 2,250 cm$^{-1}$ as determined by infrared absorption spectrometry, thereby obtaining a photosensitive resin solution containing 42.6% by weight of the epoxy acrylate (A-2) comprising an urethane bond. The thus obtained compound (A-2) had an acid value of 1 mg KOH/g or less and a glass transition temperature, which was determined by DSC measurement, of 35.5° C.

Synthesis Example A-3

To a reaction vessel, 200 g of EPOXY ESTER 3000A (manufactured by Kyoeisha Chemical Co., Ltd., molecular weight: 476.7; comprising a bisphenol A skeleton), 500 g of diethylene glycol monoethyl ether acetate, 0.5 g of 2-methylhydroquinone and 10 g of 1,4-benzenediol (molecular weight: 110.1) were added as an epoxy acrylate compound (a), reaction solvent, thermal polymerization inhibitor and diol compound, respectively, and the temperature was raised to 45° C. To this solution, as a diisocyanate compound (b), 28.6 g of hexamethylene diisocyanate (molecular weight: 168.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry, thereby obtaining a photosensitive resin solution containing 32.4% by weight of the epoxy acrylate (A-3) comprising an urethane bond. The thus obtained compound (A-3) had an acid value of 1 mg KOH/g or less and a glass transition temperature, which was determined by DSC measurement, of 79.3° C.

Synthesis Example A-4

To a reaction vessel, 200 g of EPOXY ESTER 3000A (manufactured by Kyoeisha Chemical Co., Ltd., molecular weight: 476.7; comprising a bisphenol A skeleton), 500 g of diethylene glycol monoethyl ether acetate, 0.5 g of 2-methylhydroquinone and 20 g of dihydroxypropionic acid (molecular weight: 106.1) were added as an epoxy acrylate compound (a), reaction solvent, thermal polymerization inhibitor and diol compound, respectively, and the temperature was raised to 45° C. To this solution, as a diisocyanate compound (b), 42.6 g of naphthalene-1,5-diisocyanate (molecular weight: 210.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry, thereby obtaining a photosensitive resin solution containing 34.5% by weight of the epoxy acrylate (A-4) comprising an urethane bond. The thus obtained compound (A-4) had an acid value of 35 mg KOH/g and a glass transition temperature, which was determined by DSC measurement, of 66.2° C.

Synthesis Example A-5

To a reaction vessel, 200 g of EPOXY ESTER 3000A (manufactured by Kyoeisha Chemical Co., Ltd., molecular weight: 476.7; comprising a bisphenol A skeleton), 500 g of diethylene glycol monoethyl ether acetate, 0.5 g of 2-methylhydroquinone and 75 g of dihydroxypropionic acid (molecular weight: 106.1) were added as an epoxy acrylate compound (a), reaction solvent, thermal polymerization inhibitor and diol compound, respectively, and the temperature was raised to 45° C. To this solution, as a diisocyanate compound (b), 62.8 g of hexamethylene diisocyanate (molecular weight: 168.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry, thereby obtaining a photosensitive resin solution containing 40.4% by weight of the epoxy acrylate (A-5) comprising an urethane bond. The thus obtained compound (A-5) had an acid value of 112 mg KOH/g and a glass transition temperature, which was determined by DSC measurement, of 25.4° C.

Synthesis Example A-6

To a reaction vessel, 350 g of EPOXY ESTER 70PA (manufactured by Kyoeisha Chemical Co., Ltd., molecular weight: 332.4; not comprising any bisphenol A skeleton, bisphenol F skeleton, biphenyl skeleton or hydrogenated bisphenol A skeleton), 500 g of diethylene glycol monoethyl ether acetate, 0.5 g of 2-methylhydroquinone and 80 g of dihydroxypropionic acid (molecular weight: 106.1) were added as an epoxy acrylate compound (a), reaction solvent, thermal polymerization inhibitor and diol compound comprising a carboxyl group, respectively, and the temperature was raised to 45° C. To this solution, as a diisocyanate compound (b), 121.1 g of hexamethylene diisocyanate (molecular weight: 168.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry. To the resulting solution, as an epoxy compound (d) comprising an unsaturated double bond in the molecule, 195 g of glycidyl methacrylate (molecular weight: 142.2) was added. Then, the temperature was raised to 95° C. to allow reaction to take place for 6 hours, thereby obtaining a photosensitive resin solution containing 59.9% by weight of the epoxy acrylate (A-6) comprising a urethane bond. The thus obtained compound (A-6) had an acid value of 78 mg KOH/g and a glass transition temperature, which was determined by DSC measurement, of 15.1° C.

Synthesis Example A-7

To a reaction vessel, 300 g of an acrylic acid adduct (molecular weight: 496.5) of EPOLIGHT 4000 (manufactured by Kyoeisha Chemical Co., Ltd., molecular weight: 332.4; comprising a hydrogenated bisphenol A skeleton), 500 g of diethylene glycol monoethyl ether acetate, 0.5 g of 2-methylhydroquinone and 120 g of 2,2-bis(hydroxymethyl)propionic acid (molecular weight: 134.1) were added as an epoxy acrylate compound (a), reaction solvent, thermal polymerization inhibitor and diol compound comprising a carboxyl group, respectively, and the temperature was raised to 45° C. To this solution, as a diisocyanate compound (b), 104.2 g of toluene diisocyanate (molecular weight: 174.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry. To the resulting solution, as an epoxy compound (d) comprising an unsaturated double bond in the molecule, 170 g of glycidyl methacrylate (molecular weight: 142.2) was added. Then, the temperature was raised to 95° C. to allow reaction to take place for 6 hours, thereby obtaining a photosensitive resin solution containing 58.1% by weight of the epoxy acrylate (A-7) comprising a urethane bond. The thus obtained compound (A-7) had an acid value of 102 mg KOH/g and a glass transition temperature, which was determined by DSC measurement, of 23.4° C.

Synthesis Example A-8

To a reaction vessel, 300 g of an acrylic acid adduct (molecular weight: 368) of DENACOL EX-203 (manufactured by Nagase ChemteX Corporation, molecular weight: 224; not comprising any bisphenol A skeleton, bisphenol F skeleton, biphenyl skeleton or hydrogenated bisphenol A skeleton), 500 g of diethylene glycol monoethyl ether acetate, 0.5 g of 2-methylhydroquinone and 200 g of 2,2-bis(hydroxymethyl) propionic acid (molecular weight: 134.1) were added as an epoxy acrylate compound (a), reaction solvent, thermal polymerization inhibitor and diol compound comprising a carboxyl group, respectively, and the temperature was raised to 45° C. To this solution, as a diisocyanate compound (b), 201.3 g of toluene diisocyanate (molecular weight: 174.2) was slowly added dropwise such that the reaction temperature did not exceed 50° C. After completion of the addition, the temperature was raised to 80° C. and the components were allowed to react for 6 hours until the solution no longer showed absorption at about 2,250 cm$^{-1}$ as determined by infrared absorption spectrometry. To the resulting solution, as an epoxy compound (d) comprising an unsaturated double bond in the molecule, 120 g of glycidyl methacrylate (molecular weight: 142.2) was added. Then, the temperature was raised to 95° C. to allow reaction to take place for 6 hours, thereby obtaining a photosensitive resin solution containing 62.2% by weight of the epoxy acrylate (A-8) comprising a urethane bond. The thus obtained compound (A-8) had an acid value of 83 mg KOH/g and a glass transition temperature, which was determined by DSC measurement, of 12.4° C.

Photopolymerization Initiator (B)

IRGACURE (registered trademark) 369 (manufactured by Ciba Japan Co., Ltd.)

Conductive Filler (C)

As the conductive filler (C), those materials having the respective volume-average particle sizes shown in Table 1 were used. The volume-average particle size was determined by the following method.

Measurement of Volume-Average Particle Size

The volume-average particle size of the conductive filler (C) was measured using a dynamic light-scattering particle size distribution analyzer manufactured by HORIBA Ltd.

Dicarboxylic Acid or Acid Anhydride Thereof (D)

2-propylsuccinic acid (manufactured by Tokyo Chemical Industry, Co., Ltd.)
2-hexylmalonic acid (manufactured by Tokyo Chemical Industry, Co., Ltd.)

Monomer

LIGHT ACRYLATE BP-4EA (manufactured by Kyoeisha Chemical Co., Ltd.)
EBECRYL 770 (manufactured by DAICEL-CYTEC Ltd.; acid value: 120 mg KOH/g)

Solvent

Diethylene glycol monoethyl ether acetate (manufactured by Tokyo Chemical Industry, Co., Ltd.)

Epoxy Acrylate Containing No Urethane Bond

EPOXY ESTER 3002M (manufactured by Kyoeisha Chemical Co., Ltd.; comprising a bisphenol A skeleton)
NEOPOL (registered trademark) 8317 (manufactured by Japan U-Pica Co., Ltd.; comprising a brominated bisphenol A skeleton, acid value: 110 mg KOH/g)
NEOPOL (registered trademark) 8475 (manufactured by Japan U-Pica Co., Ltd.; comprising a bisphenol F skeleton, acid value: 55 mg KOH/g)

Example 1

In a 100-mL clean bottle, 10.0 g of the photosensitive resin solution (A-1) and 1.0 g of a photopolymerization initiator, IRGACURE (registered trademark) 369 (manufactured by Ciba Japan Co., Ltd.), were mixed using "Awatori Rentaro" (registered trademark) ARE-310 (manufactured by THINKY Ltd.), thereby obtaining 11.0 g of a photosensitive resin solution (total solids: 55.6% by weight).

Then, 11.0 g of the thus obtained photosensitive resin solution and 40.9 g of Ag particles having a volume-average particle size of 2 μm were mixed and kneaded using a 3-roll mill, EXAKT M-50 (manufactured by EXAKT Advanced Technologies GmbH), thereby obtaining 51.9 g of a photosensitive conductive paste.

The thus obtained paste was coated on a 100 μm-thick PET film by screen printing and dried in a drying oven at 90° C. for 10 minutes. Then, using an exposure apparatus PEM-6M (manufactured by Union Optical Co., Ltd.), the thus dried paste was subjected to total wave length radiation exposure at an exposure dose of 150 mJ/cm$^2$ (based on the radiation having a wavelength of 365 nm) and subsequently immersion-developed in 0.25% Na$_2$CO$_3$ solution for 30 seconds. After rinsing the thus developed paste with ultrapure water, the paste was cured in a drying oven at 140° C. for 30 minutes. The resulting patterned conductive paste had a thickness of 7 μm. As a result of observing the line-and-space (L/S) pattern of the thus obtained conductive pattern under an optical microscope, no residue was found between the patterns and detachment of the patterns was not observed down to an L/S value of 20/20 μm. Therefore, it was confirmed that good patterning was attained. In addition, the specific resistivity of the conductive pattern was measured to be 7.4×10$^{-5}$ Ωcm. Furthermore, a good result was obtained also in terms of the flexibility, without any crack generation, breakage or the like after the test.

Examples 2 to 18

The photosensitive conductive pastes having the respective compositions shown in Table 1 were obtained in the same manner as in Example 1. The evaluation results thereof are shown in Table 2.

Comparative Examples 1 to 4

The photosensitive conductive pastes having the respective compositions shown in Table 1 were obtained in the same manner as in Example 1. The evaluation results thereof are shown in Table 2.

In Examples 1 to 18 where our requirements are satisfied, high-resolution patterns were formed and the curing at 140° C. yielded low-resistance conductive patterns. However, in Comparative Examples 1 to 4 where photosensitive component (A) was not used, adhesion with ITO was reduced under a high-temperature and high-humidity condition.

TABLE 1

| | Epoxy acrylate (A) comprising a urethane bond Type | Photo polymerization initiator (B) Type | Added parts to 100 parts of compound (A) (by weight) | Conductive filler (C) Amount % in paste (by mass) | Type | Average particle size (microns) | Dicarboxylic acid or acid anhydride thereof (D) Type | Added parts to 100 parts of compound (A) (by weight) | Monomer Type | Added parts to 100 parts of compound (A) (by weight) |
|---|---|---|---|---|---|---|---|---|---|---|
| Example 1 | A-1 | "IRGACURE" 369 | 20 | 87 | Ag | 2.0 | — | — | — | — |
| Example 2 | A-1 | "IRGACURE" 369 | 20 | 87 | Ag | 2.0 | 2-propyl-succinic acid | 5 | — | — |
| Example 3 | A-1 | "IRGACURE" 369 | 20 | 87 | Ag | 2.0 | 2-propyl-succinic acid | 5 | BP-4EA | 20 |
| Example 4 | A-1 | "IRGACURE" 369 | 20 | 87 | Ag | 2.0 | 2-hexyl-malonic acid | 5 | BP-4EA | 20 |
| Example 5 | A-1 | "IRGACURE" 369 | 20 | 87 | Ag | 2.0 | — | — | — | — |
| Example 6 | A-2 | "IRGACURE" 369 | 20 | 87 | Ag | 2.0 | — | — | EBECRYL 770 | 100 |
| Example 7 | A-2 | "IRGACURE" 369 | 20 | 87 | Ag | 2.0 | 2-propyl-succinic acid | 5 | EBECRYL 770 | 100 |
| Example 8 | A-3 | "IRGACURE" 369 | 20 | 87 | Ag | 2.0 | — | — | EBECRYL 770 | 100 |
| Example 9 | A-3 | "IRGACURE" 369 | 20 | 87 | Ag | 1.2 | 2-propyl-succinic acid | 5 | EBECRYL 770 | 100 |
| Example 10 | A-4 | "IRGACURE" 369 | 20 | 87 | Ag | 2.0 | — | — | EBECRYL 770 | 20 |
| Example 11 | A-4 | "IRGACURE" 369 | 20 | 87 | Ag | 2.0 | — | — | EBECRYL 770 | 20 |
| Example 12 | A-5 | "IRGACURE" 369 | 20 | 87 | Ag | 1.2 | — | — | — | — |
| Example 13 | A-5 | "IRGACURE" 369 | 20 | 87 | Ag | 1.2 | 2-propyl-succinic acid | — | BP-4EA | 20 |
| Example 14 | A-6 | "IRGACURE" 369 | 20 | 87 | Ag | 2.0 | 2-propyl-succinic acid | 5 | BP-4EA | 20 |
| Example 15 | A-7 | "IRGACURE" 369 | 20 | 87 | Ag | 2.0 | — | — | — | — |
| Example 16 | A-7 | "IRGACURE" 369 | 20 | 87 | Ag | 2.0 | 2-hexyl-malonic acid | 5 | BP-4EA | 20 |
| Example 17 | A-8 | "IRGACURE" 369 | 20 | 87 | Ag | 2.0 | — | — | BP-4EA | 20 |
| Example 18 | A-8 | "IRGACURE" 369 | 20 | 87 | Ag | 2.0 | 2-propyl-succinic acid | — | — | — |
| Comparative Example 1 | EPOXY ESTER 3002M | "IRGACURE" 369 | 20 | 87 | Ag | 2.0 | — | — | EBECRYL 770 | 20 |
| Comparative Example 2 | EPOXY ESTER 3002M | "IRGACURE" 369 | 20 | 87 | Ag | 2.0 | 2-hexyl-malonic acid | 5 | EBECRYL 770 | 20 |
| Comparative Example 3 | NEOPOL 8317 | "IRGACURE" 369 | 20 | 87 | Ag | 2.0 | — | — | BP-4EA | 20 |
| Comparative Example 4 | NEOPOL 8475 | "IRGACURE" 369 | 20 | 87 | Ag | 1.0 | 2-propyl-succinic acid | 5 | — | — |

TABLE 2

| | Production condition | | Developable L/s (microns) | Properties of conductive pattern | | Adhesion with ITO Number of remaining grids |
|---|---|---|---|---|---|---|
| | Substrate | Cure condition | | Specific resistivity ($\Omega$ cm) | Flexibility | |
| Example 1 | PET film | 140° C. × 30 min | 20/20 | $7.4 \times 10^{-5}$ | good | 100 |
| Example 2 | PET film | 140° C. × 30 min | 20/20 | $4.3 \times 10^{-5}$ | good | 100 |
| Example 3 | PET film | 140° C. × 30 min | 20/20 | $4.5 \times 10^{-5}$ | good | 100 |
| Example 4 | PET film | 140° C. × 30 min | 20/20 | $3.6 \times 10^{-5}$ | good | 100 |
| Example 5 | PET film | 140° C. × 30 min | 20/20 | $8.2 \times 10^{-5}$ | good | 100 |
| Example 6 | PET film | 140° C. × 30 min | 20/20 | $7.5 \times 10^{-5}$ | good | 100 |
| Example 7 | PET film | 140° C. × 30 min | 20/20 | $5.5 \times 10^{-5}$ | good | 100 |
| Example 8 | PET film | 140° C. × 30 min | 20/20 | $6.5 \times 10^{-5}$ | good | 100 |
| Example 9 | PET film | 140° C. × 30 min | 20/20 | $4.5 \times 10^{-5}$ | good | 100 |
| Example 10 | PET film | 140° C. × 30 min | 20/20 | $6.2 \times 10^{-5}$ | good | 100 |
| Example 11 | PET film | 140° C. × 30 min | 20/20 | $7.1 \times 10^{-5}$ | good | 100 |
| Example 12 | PET film | 140° C. × 30 min | 20/20 | $5.9 \times 10^{-5}$ | good | 100 |
| Example 13 | PET film | 140° C. × 30 min | 20/20 | $4.7 \times 10^{-5}$ | good | 100 |
| Example 14 | PET film | 140° C. × 30 min | 20/20 | $5.1 \times 10^{-5}$ | good | 100 |
| Example 15 | PET film | 140° C. × 30 min | 20/20 | $7.2 \times 10^{-5}$ | good | 100 |
| Example 16 | PET film | 140° C. × 30 min | 20/20 | $3.5 \times 10^{-5}$ | good | 100 |
| Example 17 | PET film | 140° C. × 30 min | 20/20 | $6.8 \times 10^{-5}$ | good | 100 |
| Example 18 | PET film | 140° C. × 30 min | 20/20 | $4.1 \times 10^{-5}$ | good | 100 |
| Comparative Example 1 | PET film | 140° C. × 30 min | 50/50 | $1.4 \times 10^{-4}$ | good | 53 |
| Comparative Example 2 | PET film | 140° C. × 30 min | 50/50 | $8.3 \times 10^{-5}$ | good | 43 |
| Comparative Example 3 | PET film | 140° C. × 30 min | 30/30 | $7.3 \times 10^{-4}$ | good | 3 |
| Comparative Example 4 | PET film | 140° C. × 30 min | 30/30 | $2.4 \times 10^{-4}$ | good | 0 |

The invention claimed is:

1. A photosensitive conductive paste comprising:
an epoxy acrylate (A) comprising a urethane bond;
a photopolymerization initiator (B); and
a conductive filler (C),
wherein an added amount of the conductive filler (C) is 70 to 95% by weight with respect to the total solids in the photosensitive conductive paste.

2. The photosensitive conductive paste according to claim 1, wherein said epoxy acrylate (A) comprising a urethane bond comprises a carboxyl group.

3. The photosensitive conductive paste according to claim 2, wherein said epoxy acrylate (A) comprising a urethane bond has an acid value of 40 to 250 mg KOH/g.

4. The photosensitive conductive paste according to claim 2, wherein said epoxy acrylate (A) comprising a urethane bond contains an unsaturated double bond.

5. The photosensitive conductive paste according to claim 2, wherein said epoxy acrylate (A) comprising a urethane bond has a bisphenol A skeleton, a bisphenol F skeleton, a biphenyl skeleton or a hydrogenated bisphenol A skeleton.

6. The photosensitive conductive paste according to claim 2, wherein said epoxy acrylate (A) comprising a urethane bond has a glass transition temperature of −10 to 60° C.

7. The photosensitive conductive paste according to claim 1, wherein said epoxy acrylate (A) comprising a urethane bond has an acid value of 40 to 250 mg KOH/g.

8. The photosensitive conductive paste according to claim 7, wherein said epoxy acrylate (A) comprising a urethane bond contains an unsaturated double bond.

9. The photosensitive conductive paste according to claim 7, wherein said epoxy acrylate (A) comprising a urethane bond has a bisphenol A skeleton, a bisphenol F skeleton, a biphenyl skeleton or a hydrogenated bisphenol A skeleton.

10. The photosensitive conductive paste according to claim 7, wherein said epoxy acrylate (A) comprising a urethane bond has a glass transition temperature of −10 to 60° C.

11. The photosensitive conductive paste according to claim 1, wherein said epoxy acrylate (A) comprising a urethane bond contains an unsaturated double bond.

12. The photosensitive conductive paste according to claim 11, wherein said epoxy acrylate (A) comprising a urethane bond has a bisphenol A skeleton, a bisphenol F skeleton, a biphenyl skeleton or a hydrogenated bisphenol A skeleton.

13. The photosensitive conductive paste according to claim 11, wherein said epoxy acrylate (A) comprising a urethane bond has a glass transition temperature of −10 to 60° C.

14. The photosensitive conductive paste according to claim 1, wherein said epoxy acrylate (A) comprising a urethane bond has a bisphenol A skeleton, a bisphenol F skeleton, a biphenyl skeleton or a hydrogenated bisphenol A skeleton.

15. The photosensitive conductive paste according to claim 14, wherein said epoxy acrylate (A) comprising a urethane bond has a glass transition temperature of −10 to 60° C.

16. The photosensitive conductive paste according to claim 1, wherein said epoxy acrylate (A) comprising a urethane bond has a glass transition temperature of −10 to 60° C.

17. The photosensitive conductive paste according to claim 1, further comprising a dicarboxylic acid or an acid anhydride thereof (D).

18. A method of producing a conductive pattern comprising:
coating the photosensitive conductive paste according to claim 1 on a substrate, drying, exposing and developing the thus coated photosensitive conductive paste; and
subsequently curing said photosensitive conductive paste at a temperature of 100° C. to 300° C.

19. A touch panel comprising the conductive pattern produced by the method of claim 18.

* * * * *